United States Patent
Kobayashi et al.

(10) Patent No.: US 7,642,543 B2
(45) Date of Patent: Jan. 5, 2010

(54) SEMICONDUCTOR LIGHT EMITTING DEVICE HAVING METAL REFLECTIVE LAYER

(75) Inventors: Seiichiro Kobayashi, Tokyo (JP); Kazuyuki Yoshimizu, Yamato (JP)

(73) Assignee: Stanley Electric Co., Ltd., Tokyo (JP)

( * ) Notice: Subject to any disclaimer, the term of this patent is extended or adjusted under 35 U.S.C. 154(b) by 117 days.

(21) Appl. No.: 11/906,903

(22) Filed: Oct. 4, 2007

(65) Prior Publication Data

US 2008/0169481 A1 Jul. 17, 2008

(30) Foreign Application Priority Data

Oct. 11, 2006 (JP) ............... 2006-277251

(51) Int. Cl.
*H01L 31/00* (2006.01)
(52) U.S. Cl. .............. 257/13; 257/94; 257/97; 257/E33.001; 438/22; 438/46; 438/47
(58) Field of Classification Search ........ None
See application file for complete search history.

(56) References Cited

U.S. PATENT DOCUMENTS

2006/0057817 A1* 3/2006 Sonoda et al. ............ 438/455

2007/0105247 A1* 5/2007 Mauersberger et al. ....... 438/16

FOREIGN PATENT DOCUMENTS

| JP | 2001-044491 A | 2/2001 |
|----|---------------|--------|
| JP | 2001-189490 A | 7/2001 |
| JP | 2002-217450 A | 8/2002 |

* cited by examiner

*Primary Examiner*—Evan Pert
*Assistant Examiner*—Scott R Wilson
(74) *Attorney, Agent, or Firm*—Frishauf, Holtz, Goodman & Chick, P.C.

(57) ABSTRACT

A semiconductor light emitting device including: a support substrate; a composite connection layer formed above the support substrate, the composite connection layer including a first connection layer and a second connection layer; a diffusion barrier layer formed above the composite connection layer; a semiconductor lamination structure formed above the diffusion barrier layer; and a reflective electrode layer formed between the diffusion barrier layer and the semiconductor lamination structure, wherein: at least one of the first and second connection layers is made of eutectic material; and the diffusion barrier layer has a lamination structure having TaN layers sandwiching at least one refractory metal layer made of one or more refractory metal materials of Ta, Ti, Mo, W and TiW or alloy thereof. It is possible to prevent defects such as stripping and cracks at bonding planes and improve reliability of a final semiconductor light emitting device.

12 Claims, 3 Drawing Sheets

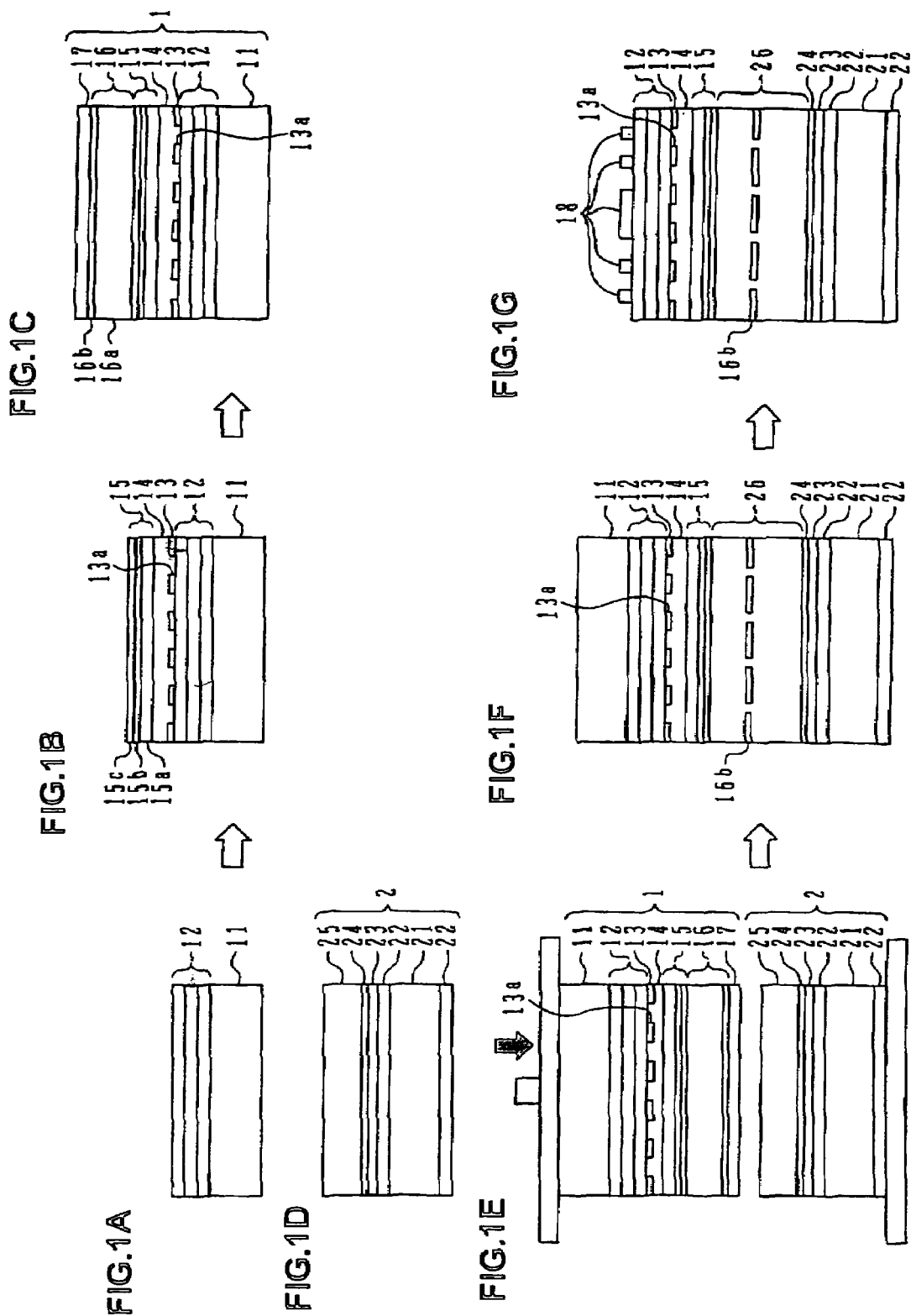

SEMICONDUCTOR LIGHT EMITTING DEVICE HAVING METAL REFLECTIVE LAYER

CROSS REFERENCE TO RELATED APPLICATION

This application is based on and claims priority of Japanese Patent Application No. 2006-277251 filed on Oct. 11, 2006, the entire contents of which are incorporated herein by reference.

BACKGROUND OF THE INVENTION

A) Field of the Invention

The present invention relates to a semiconductor light emitting device, and more particularly to a light emitting device having a metal reflective layer.

B) Description of the Related Art

In order to develop a higher illuminance light emitting device such as a light emitting diode (LED), it is very important to improve an optical output efficiency of light to be guided to an external of the device. For example, in a structure that a semiconductor lamination structure made of aluminum gallium indium phosphorus (AlGaInP) is stacked on a gallium arsenic (GaAs) substrate, light radiated toward the substrate among light emitted in an active layer is absorbed in the GaAs substrate so that a high optical output efficiency cannot be obtained. It is therefore an important approach to a high luminance no to make the light propagating toward the substrate among light omnidirectionally emitted be absorbed in the substrate, but to guide the light to an external of the device.

As an approach to improving the optical output efficiency, there has been proposed a bonding type structure that after a semiconductor lamination structure is epitaxially grown on a temporary substrate, the temporary substrate is removed, and a metal reflective layer for reflecting emitted light is formed and bonded to a conductive substrate such as a metal substrate.

Semiconductor light emitting devices of this type are proposed, for example, in JP-A-2001-189490, JP-A-2001-44491 and JP-A-2002-217450.

SUMMARY OF THE INVENTION

A semiconductor device of the bonding type is exposed to a high temperature of about 300 to 500° C. during a bonding process, an alloying process for obtaining ohmic contact, and the like. Therefore, a method has been proposed for suppressing reduction in a reflectivity of a reflective layer and deterioration of ohmic contact, by disposing a barrier layer for preventing invasion/diffusion of elements, between the reflective layer and a bonding layer. As a barrier layer, generally a single layer or a composite layer is used which is made of refractory metal such as titanium (Ti), tantalum (Ta), tungsten (W) and platinum (Pt), or refractory metal nitride such as titanium nitride (TiN) and tantalum nitride (TaN).

However, if the above-described thermal history is applied to these barrier layers, stripping (including swelling not complete stripping) occurs at the interfaces with the reflective layer and bonding layer because of stress and the like, causing lowered reliability. Further, solder and eutectic material may invade into the reflective layer or electrode material may scatter, respectively through cracks, resulting in lower reflection characteristic of the reflective layer and defective ohmic contact, resulting in deteriorated electric characteristics. If the reflective layer structure is made of particularly a composite body constituted of ohmic electrodes partially formed on the semiconductor lamination structure and a reflective layer, stress is likely to be concentrated upon stepped portions and a defect occurrence possibility becomes high.

It is an object of the present invention to provide a semiconductor light emitting device with improved reliability According to one aspect of the present invention, there is provided a semiconductor light emitting device comprising:

a support substrate;

a composite connection layer formed above the support substrate, the composite connection layer including a first connection layer and a second connection layer;

a diffusion barrier layer formed above the composite connection layer;

a semiconductor lamination structure formed above the diffusion barrier layer; and a reflective electrode layer formed between the diffusion barrier layer and the semiconductor lamination structure, wherein:

at least one of the first and second connection layers is made of eutectic material; and the diffusion barrier layer has a lamination structure having TaN layers sandwiching at least one refractory metal layer made of one or more refractory metal materials of Ta, Ti, Mo, W and TiW or alloy thereof.

According to another aspect of the present invention, there is provided a manufacture method for a semiconductor light emitting device, comprising steps of:

forming a support body by forming a first connection layer above a support substrate;

forming a lamination body above a growth substrate prepared separately from the support substrate, the lamination body being formed by depositing a semiconductor lamination structure, a reflective electrode layer, a diffusion barrier layer having a lamination structure having TaN layers sandwiching at least one refractory metal layer made of one or more refractory metal materials of Ta, Ti, Mo, W and TiW or alloy thereof, and a second connection layer, sequentially in an order recited;

forming a composite connection layer by coupling the first connection layer of the support body and the second connection layer of the lamination body; and removing the growth substrate, wherein at least one of the first and second connection layers is made of eutectic material.

According to the present invention, it is possible to suppress reduction in a reflectivity of a reflective electrode layer, to prevent deterioration of ohmic characteristics (electric characteristics), and to improve reliability of a semiconductor light emitting device.

BRIEF DESCRIPTION OF THE DRAWINGS

FIGS. 1A to 1G are schematic cross sectional views illustrating a manufacture method for a semiconductor light emitting device, according to an embodiment.

DESCRIPTION OF THE PREFERRED EMBODIMENTS

Figure 2A:
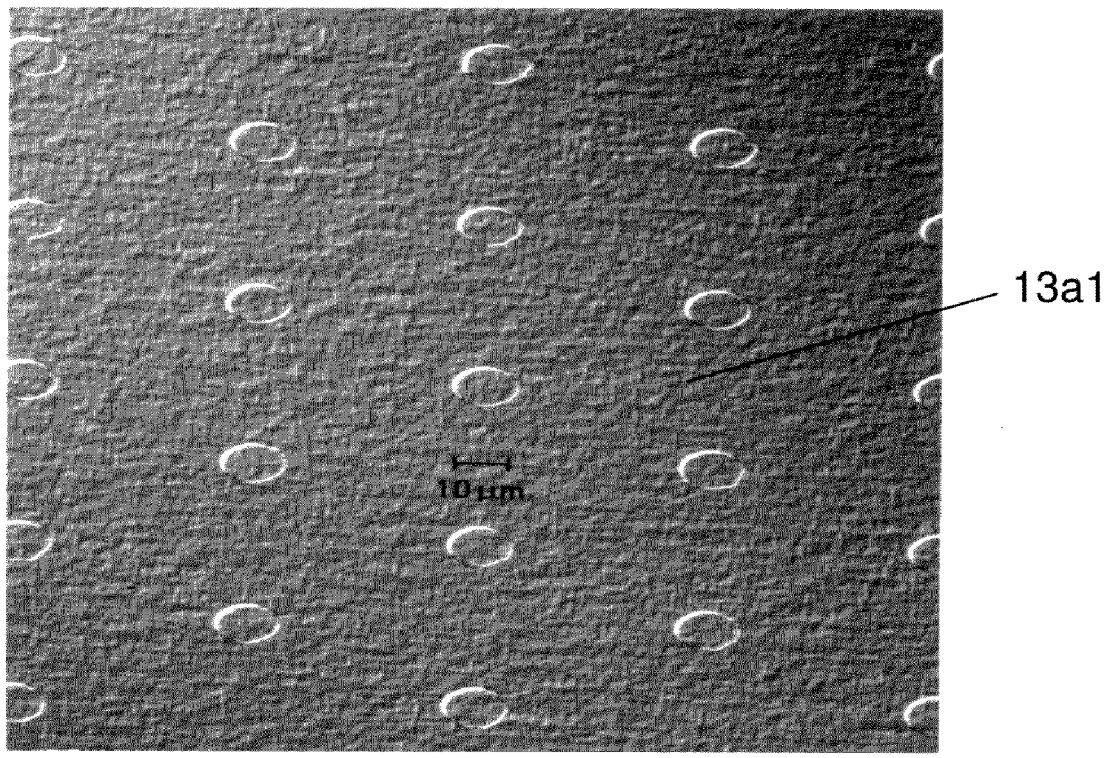
FIG. 2A is a microscopic photograph showing a reflective electrode layer after alloying sample A, as viewed downward.

Description will now be made on a manufacture method for a semiconductor light emitting device according to an embodiment of the present invention.

FIGS. 1A to 1G are schematic cross sectional views illustrating manufacture processes for a semiconductor light emitting device according to the embodiment.

As shown in FIG. 1A, a semiconductor lamination structure 12 is epitaxially grown on a semiconductor substrate 11, for example, by MOCVD or the like. As current is flowed through a semiconductor active layer contained in the semiconductor lamination structure 12, light having a wavelength inherent to the semiconductor is emitted. In this embodiment, the semiconductor lamination structure 12 is made of a compound semiconductor layer made of AlGaInP-based material different from that of the semiconductor substrate 11 which is a GaAs substrate capable of lattice matching the semiconductor lamination structure 12. The semiconductor lamination structure 12 may adopt a multi quantum well (MQW) structure, as well as a single quantum well (SQW) structure, a homo pn junction, a single hetero (SH) structure, a double hetero (DH) structure and the like. The semiconductor lamination structure includes a buffer layer, a clad layer, a current diffusion layer, a contact layer and the like, when proper.

As shown in FIG. 1B, it is preferable to form an SiO₂ layer 13 on the semiconductor lamination structure 12. The SiO₂ layer 13 together with a reflective electrode layer 14 to be described later constitutes a reflective layer for reflecting light emitted to the side opposite to an optical output side among light emitted in the semiconductor lamination structure 12, toward the optical output side to thereby improve an optical output efficiency. If the reflective layer is made of only a metal film, it is difficult to maintain both the performances of the reflection characteristics and ohmic contact. This is because if alloying is performed for obtaining ohmic contact, a reflectivity lowers because degraded morphology or electrode material diffusion caused by the formation of an alloy layer at the interfaces with the semiconductor layer and electrode.

After the SiO₂ layer 13 is formed on the semiconductor lamination structure 12, for example, by CVD, thermal CVD, sputtering or the like, an opening process is performed to form holes having a desired shape by photolithography and etching. Recesses 13a formed by the opening process expose the semiconductor lamination structure 12 on the bottoms thereof. Etching may be either wet or dry etching. In this embodiment, wet etching was performed by using buffered hydrofluoric acid (BHF).

A thickness of the SiO₂ layer 13 was set in a range where a high reflectivity was obtained through simulation. A film thickness was set to 90 nm in this embodiment.

Thereafter, the reflective electrode layer 14 is formed. In the manufactured semiconductor light emitting device, the reflective electrode layer 14 functions not only as the electrode but also as the reflective layer together with the SiO₂ layer 13.

The reflective electrode layer 14 is made of metal capable of forming ohmic contact with the semiconductor lamination structure 12, and formed on the semiconductor lamination structure 12 and SiO₂ layer 13 by resistance heating evaporation, electron beam (EB) evaporation, sputtering method or the like. In this embodiment, the semiconductor lamination structure 12 is made of AlGaInP-based compound, and the reflective electrode layer 14 is formed to a thickness of 300 nm by sputtering AuZn. The reflective electrode layer 14 ohmic-contacts the semiconductor lamination structure 12 on the bottoms of the recesses 13a of the SiO₂ layer by an alloying process to be later described, and functions as an ohmic electrode.

A diffusion barrier layer 15 is formed on the reflective electrode layer 14. The diffusion barrier layer 15 has a three-layer structure made of refractory metal Ta sandwiched between TaN layers. The diffusion barrier layer is formed by sputtering and has a thickness of 200 nm of a first TaN layer 15a, a thickness of 50 nm of a Ta layer 15b and a thickness of 100 nm of a second TaN layer 15c. The thickness of the first TaN layer 15a contacting the SiO₂ layer 13 is thicker than that of the SiO₂ layer 13, and is required to be at least 150 nm. The intermediate Ta layer 15b has a thickness of, e.g., 10 to 100 nm.

The diffusion barrier layer 15 is used for preventing Zn in AuZn from diffusing to the external, and preventing eutectic material from invading (diffusing) toward the reflective electrode layer 14 side when bonding, at a later process, a lamination body 1 including the semiconductor lamination structure 12 to a support body 2. If the function of the diffusion barrier layer 15 does not work, ohmic characteristics between the semiconductor lamination structure 12 and reflective electrode layer 14 are degraded by the influence of heat at the later process, resulting in deterioration of electric characteristics, such as a rise in a forward voltage drop Vf and the like. At the same time, the optical output efficiency lowers because of a lowered reflectivity so that the illuminance of the semiconductor light emitting device lowers.

Material of the intermediate refractory metal (Ta) layer 15b of the diffusion barrier layer 15 is not limited to Ta, but one or more refractory metals selected from a group consisting of Ta, Ti, Mo, W, TiW and the like or alloy thereof may also be used.

After the diffusion barrier layer 15 is formed, an alloying process is executed to form good ohmic contact between the semiconductor lamination structure 12 and reflective electrode layer 14 (p-type electrode). In this embodiment, since AuZn is adopted as the material of the electrode layer relative to p-type AlGaInP, heat treatment was performed at about 500° C. in a nitrogen atmosphere.

As shown in FIG. 1C, after the alloying process, an auxiliary connection layer (having a lamination structure of a first auxiliary connection layer 16a and a second auxiliary connection layer 16b) 16 is deposited. The first auxiliary connection layer 16a is made of Al, the second auxiliary connection layer 16b is made of Ta, and film thicknesses of the first and second auxiliary connection layers are set to 200 nm to 1000 nm, and 100 nm to 200 nm, respectively.

In depositing Al, although an EB method was used, resistance heating evaporation or sputtering may also be used. Al may be deposited by resistance heating evaporation or sputtering. Ta is deposited by the EB method because it is refractory metal.

A metal layer 17 is formed, for example, by depositing Au by resistance heating evaporation to a thickness of 200 nm.

Called the lamination body 1 is a lamination structure of the semiconductor substrate 11, semiconductor lamination structure 12, SiO₂ layer 13, reflective electrode layer 14, diffusion barrier layer 15, auxiliary connection layer 16 and metal layer 17.

As show in FIG. 1D, on one surface of a conductive substrate 21, an ohmic metal layer 22 is formed, and on the other surface thereof, an ohmic metal layer 22, a tight adhesion layer 23, a wettability improving layer 24 and an eutectic coupling layer 25 are sequentially deposited.

An evaporation method may be a method properly selected from a group of resistance heating, EB, and sputtering.

For example, an Si substrate doped with, for example, p-type impurities at a high concentration is used as the conductive substrate 21. Pt is used for the ohmic metal layer 22 which has a thickness of 100 to 300 nm. In this embodiment, the thickness is set to 200 nm.

The material of the ohmic metal layer 22 is not limited to Pt, but other metals capable of forming ohmic contact with the Si substrate may also be used, such as Au, Ni and Ti. If the latter metal is used, an alloying process is performed when necessary in a nitrogen atmosphere to obtain ohmic contact with the Si substrate.

The conductive substrate 21 is not limited to the Si substrate, but may be made of conductive material having a high heat conductivity such as Al and Cu.

The tight adhesion layer 23 is made of Ti, and the wettability improving layer 24 is made of, for example, Ni. These layers 23 and 24 have a thickness of 100 nm to 200 nm and a thickness of 50 nm to 150 nm, respectively. In this embodiment, the tight adhesion layer 23 is set to 150 nm, and the wettability improving layer 24 is set to 100 nm. The wettability improving layer 24 may be made of NiV, Pt or the like, instead of Ni.

The eutectic coupling layer 25 is made of AuSn and has a thickness of 300 nm to 3000 nm. In this embodiment, the thickness is set to 400 nm. The composition is desired to be Au:Sn=about 80:about 20 for wt % (Au:Sn=about 70:about 30 for at %). Although the eutectic coupling layer 25 has AuSn as its may component, AuSn may contain additive.

Called the support body 2 is a collection of the conductive substrate 21, ohmic metal layer 22, tight adhesion layer 23, wettability improving layer 24 and eutectic coupling layer 25.

Disposing the tight adhesion layer 23 and wettability improving layer 24 presents the following advantages.

First, adhesion reliability of the finished support member can be made sufficient. If the support body 20 does not have these layers, stripping may occur during a later process of thermocompression bonding to the lamination body 1.

Second, a ball-up of the AuSn layer can be prevented at the later process of thermocompression bonding to the lamination body 1. The ball-up is a phenomenon that when AuSn once liquidized at an eutectic temperature or higher is solidified again during lowering a temperature, AuSn partially builds up by segregation.

As shown in FIGS. 1E and 1F, the lamination body 1 and support body 2 are bonded, for example, by thermocompression bonding. In this example, by applying a temperature and pressure allowing eutectic material to melt, the eutectic coupling layer (AuSn layer) 25 as a first connection layer and the metal layer (Au layer) 17 as a second connection layer form new eutectic material (AuSn), to thereby bond together the lamination body 1 and support body 2. In this case, since the eutectic material AuSn melts, it is necessary to fix the lamination body 1 and support body 2 by a proper method. Bonding is performed at about 1 MPa and 300° C. for 10 minutes in a nitrogen atmosphere, while the metal layer 17 of the lamination body 1 and the eutectic coupling layer 25 of the support body 2 are maintained in a tight contact state.

The bonding conditions are not limited to those described above, so long as the bonding material, bonding atmosphere, bonding temperature and time are sufficient for bonding together the lamination body 1 and support body 2 while allowing used eutectic material to be melted and not changing the eutectic material characteristics (e.g., lowered bonding strength to be caused by oxidation or the like).

A connection layer newly formed by thermocompression bonding is similar to that described in paragraphs [0023] to [0079] of JP-A-2004-267159 previously submitted by the present inventors. The synopsis thereof will be described briefly in the following.

As the metal layer (Au) 17 of the lamination body 1 and the eutectic coupling layer (AuSn) 25 of the support body 2 are bonded by thermocompression bonding, a new connection layer of AuSn is formed. At the same time when Al in the auxiliary connection layer 16a diffuses to the AuSn layer side via a broken portion of Ta of the auxiliary connection layer 16b, the AuSn layer diffuses to the auxiliary connection layer 16a side. From these diffusions, a composite connection layer 26 containing AuSnAl alloy is formed.

Since the eutectic coupling layer 25 is made of AuSn having the composition described above, this layer melts at about 280° C. However, the composite connection layer 26 will not melt perfectly even if is heated to 400° C. to 500° C. Therefore, the composite connection layer will not be melted again even during a heating process after the bonding process, to be later described, and stripping can be prevented providing a connection of high reliability. Further, since Al is contained, good tight adhesion to the diffusion barrier layer 15 can be maintained.

Description will continue reverting to the embodiment.

As shown in FIG. 1G, after the lamination body 1 and support body 2 are bonded, the semiconductor substrate 11 on the side of the lamination body 1 is removed. In this embodiment, the semiconductor substrate 11 was removed by wet etching using mixture etchant of ammonia and hydrogen peroxide. Removing the semiconductor substrate 11 is not limited to wet etching, but dry etching, mechanical polishing, or chemical mechanical polishing (CMP), or a combination thereof including at least one of these methods may also be used.

After the semiconductor substrate 11 is removed, front electrodes 18 in ohmic contact with the semiconductor lamination structure 12 are formed on the semiconductor lamination structure 12 exposed on the surface of the semiconductor light emitting device.

In this example, since the n-type semiconductor is exposed on the surface where the front electrodes 18 are to be formed, as the material of the front electrodes, AuGeNi was used which is well known as the material capable of forming ohmic contact with the n-type semiconductor. The front electrodes may be made of AuGe, AuSn, AuSnNi or the like.

For example, the front electrodes 18 are formed by lift-off. According to the lift-off method, photoresist is coated on the semiconductor lamination structure 12, and by using a photomask, the photoresist is selectively exposed and developed to form a photoresist pattern having desired electrode shapes, electrode material is deposited, and thereafter the photoresist is removed together with an unnecessary metal layer on the photoresist.

An evaporation method for electrode material may by EB evaporation, sputtering or the like, in addition to resistance heating evaporation.

Further, alloying is performed by heat treatment at about 400° C. in a nitrogen atmosphere, in order to obtain good ohmic contact between the semiconductor lamination structure 12 and front electrodes 18 (n-side electrodes).

With the above-described processes, the semiconductor light emitting device can be manufactured.

Next, with reference to photographs, description will be made on the three-layer structure of the diffusion buffer layer 15 which effectively suppresses defects such as stripping (including swelling) and cracks to be formed at the interfaces with between the reflective electrode layer 14 and composite connection layer 26 by heating for eutectic coupling, annealing and the like.

The present inventors observed a semiconductor light emitting device sample A manufactured by the embodiment method and a semiconductor light emitting device sample B as a comparative example having the structure similar to that of the sample A excepting that the diffusion barrier layer 15 is of a single layer structure.

Figure 2B:
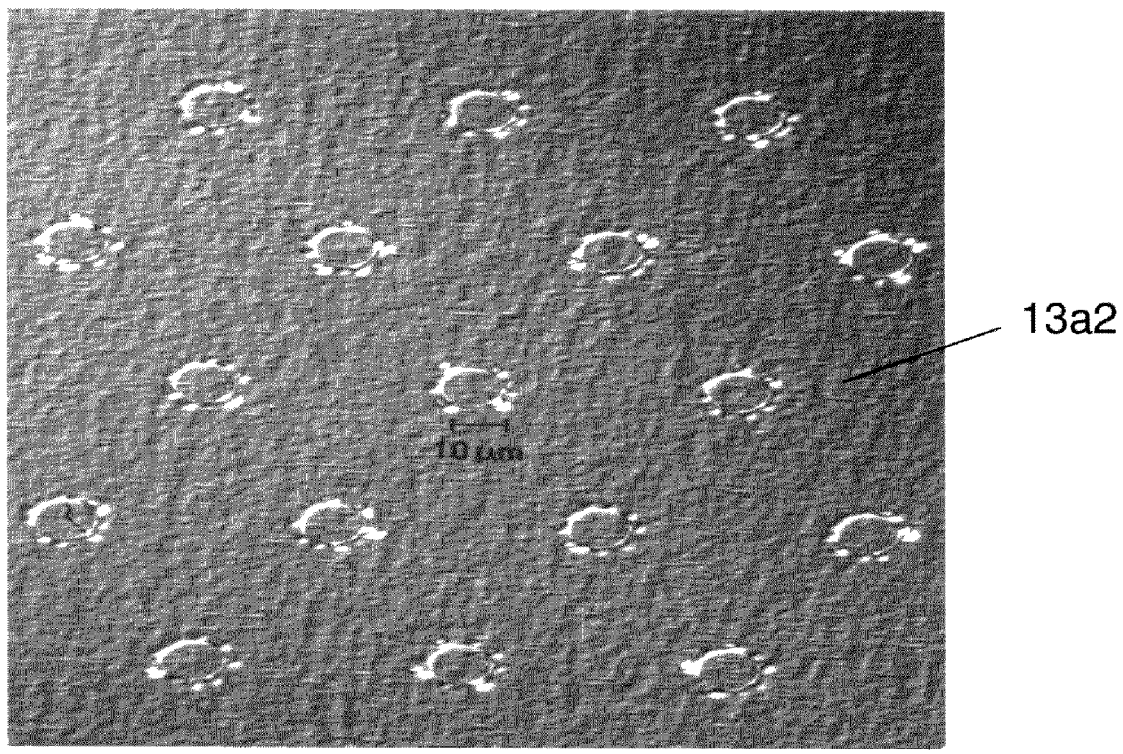
FIG. 2B is a microscopic photograph showing a reflective electrode layer after alloying sample B.

FIG. 2A is a microscopic photograph showing the reflective electrode layer of sample A as viewed downward, after a heat treatment process for alloying the interface portions with the semiconductor lamination structure 12 and reflective electrode layer 14, and FIG. 2B is a microscopic photograph showing the reflective electrode layer of sample B as viewed downward, after a heat treatment process for alloying the interface portions with the semiconductor lamination structure 12 and reflective electrode layer 14. In FIGS. 2A and 2B, circle portions 13a1 and 13a2 correspond to the $SiO_2$ removed regions.

As shown in FIG. 2B, a film swelling is observed at the border of the region of each recess 13a2 of the reflective electrode layer of sample B. On the other hand, as shown in FIG. 2A, a film swelling is not observed at the border of the region of each recess 13a1 of the reflective electrode layer of sample B.

The present inventors observed by changing a film thickness of the Ta layer of the reflective electrode layer of sample A. In the range of a Ta layer thickness of 10 nm to 150 nm, a film swelling did not occur at the border of the reflective electrode layer recess 131a. This range is expected to be the optimum range of a film thickness of the Ta layer.

Figure 3A:
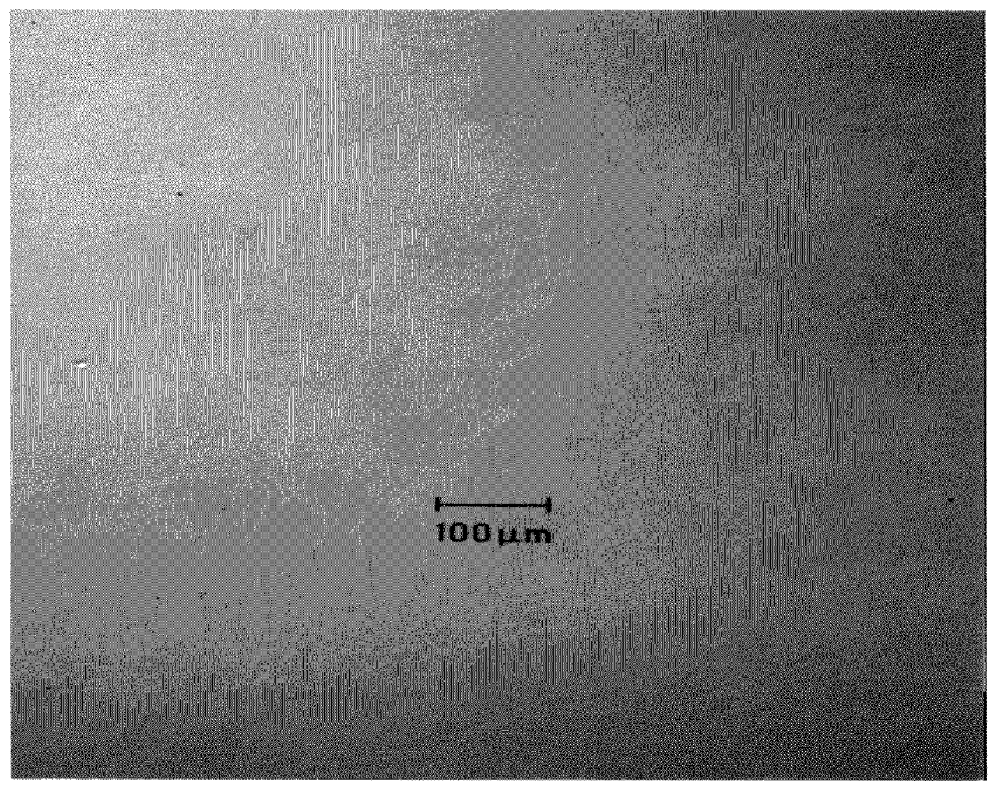
FIG. 3A is a microscopic photograph showing a connection layer after a bonding process for sample A, as viewed downward.
Figure 3B:
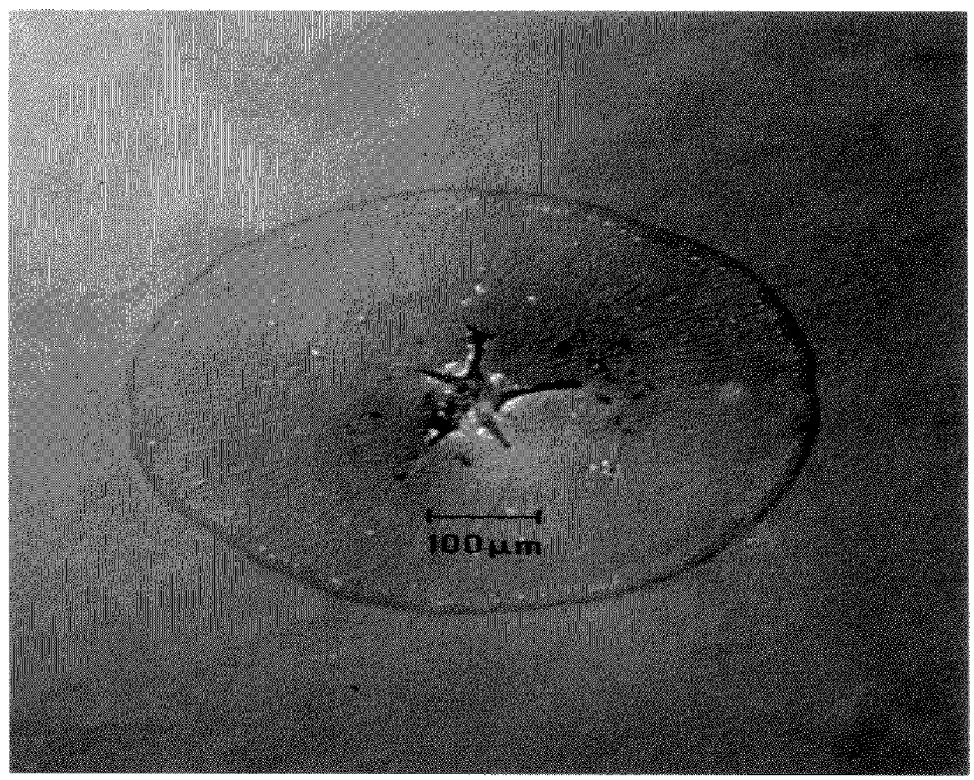
FIG. 3B is a microscopic photograph showing a connection layer after a bonding process for sample B, as viewed downward.

FIG. 3A is a microscopic photograph showing the connection layer after a bonding process for sample A (before forming the front electrodes 18), as viewed on the semiconductor lamination structure 12 side, and FIG. 3B is a microscopic photograph showing the connection layer after a bonding process for sample B (before forming the front electrodes 18), as viewed on the semiconductor lamination structure 12 side.

As shown in FIG. 3B, it can be confirmed that the barrier layer of sample B is torn. On the other hand, as shown in FIG. 3A, it can be confirmed that the barrier layer of sample A is not torn, providing an excellent performance of the barrier layer.

As described above, the barrier layer for solder or eutectic material of a semiconductor light emitting layer has a lamination structure of refractory metal such as Ti, Ta, W, Mo and TiW or alloy thereof sandwiched between TaN. It is therefore possible to relax stress by a bonding process or a heating process for alloy or the like, and to prevent occurrence of stripping (including swelling) and cracks at the interfaces with the reflection layer and connection layer. If a pattern is formed in the reflective electrode layer, defects at steps can be prevented considerably. As a result, it is possible to prevent a lowered resistivity and degraded ohmic characteristics (electric characteristics) to be caused by invasion of eutectic material into the reflective electrode layer.

With these advantageous effects, it is possible to improve reliability of a final semiconductor light emitting device.

The present invention has been described in connection with the preferred embodiments. The invention is not limited only to the above embodiments. For example, the refractory metal layer 15b may be made of a plurality of layers. In this case, Ti having a high tight adhesion performance may be used as the material of layers of the multi layer refractory metal layer 15b on the side contacting the TaN layer. The lamination structure of the diffusion barrier layer 15b is not limited to three layers, but may be a multi layer structure of four or more layers alternately stacking refractory metal and TaN. A layer made of material other than TaN and refractory metal, e.g., a tight adhesion layer of Ni, may be inserted between the TaN layer and refractory metal layer.

The bonding process may be performed after the first and second connection layers are formed on the semiconductor side.

It will be apparent to those skilled in the art that other various modifications, improvements, combinations, and the like can be made.

What is claimed is:

1. A semiconductor light emitting device comprising:
   a support substrate;
   a composite connection layer formed above said support substrate, said composite connection layer including a first connection layer and a second connection layer;
   a diffusion barrier layer formed above said composite connection layer;
   a semiconductor lamination structure, including semiconductor active layers, formed above said diffusion barrier layer; and
   a reflective electrode layer formed between said diffusion barrier layer and said semiconductor lamination structure,
   wherein:
      at least one of said first and second connection layers is made of eutectic material;
      said diffusion barrier layer has a lamination structure including TaN layers sandwiching at least one refractory metal layer made of one or more refractory metal materials of Ta, Ti, Mo, W and TiW or alloy thereof; and
      a thickness of said TaN layer on a side of said composite connection layer is thinner than a thickness of said TaN layer on a side of said reflective electrode layer and thicker than a thickness of said refractory metal layer.

2. The semiconductor light emitting device according to claim 1, wherein said first connection layer in a support body including said first connection layer and said support substrate is structured to be coupled to said second connection layer in a lamination body including said second connection layer, said diffusion barrier layer, said reflective electrode layer and said semiconductor lamination structure.

3. The semiconductor light emitting device according to claim 1, wherein said composite connection layer has an auxiliary connection layer for preventing diffusion of said eutectic material and improving a tight adhesion of said composite connection layer.

4. The semiconductor light emitting device according to claim 1, wherein a thickness of said refractory metal layer is 10 nm to 150 nm.

5. The semiconductor light emitting device according to claim 1, further comprising a reflective layer made of dielectric material as a main component, said reflective layer being disposed between said semiconductor lamination structure and said reflective electrode layer and partially covering a surface of said semiconductor lamination structure on a side of said reflective electrode layer.

6. The semiconductor light emitting device according to claim 5, wherein the thickness of said TaN layer on the side of said reflective electrode layer is thicker than a thickness of said reflective layer.

7. A manufacture method for a semiconductor light emitting device, said method comprising:

forming a support body by forming a first connection layer above a support substrate;

forming a lamination body above a growth substrate prepared separately from said support substrate, said lamination body being formed by depositing a semiconductor lamination structure including semiconductor active layers, a reflective electrode layer, a diffusion barrier layer having a lamination structure including TaN layers sandwiching at least one refractory metal layer made of one or more refractory metal materials of Ta, Ti, Mo, W and TiW or alloy thereof, and a second connection layer, sequentially in this order;

forming a composite connection layer by coupling said first connection layer of said support body and said second connection layer of said lamination body by thermocompression bonding; and removing said growth substrate, wherein at least one of said first and second connection layers is made of eutectic material, and said thermocompression bonding is carried out under a temperature and pressure that allow the eutectic material to melt.

8. The manufacture method for a semiconductor light emitting device according to claim 7, further comprising a heat treatment step after a process of forming said diffusion barrier layer.

9. The manufacture method for a semiconductor light emitting device according to claim 7, wherein a thickness of said refractory metal layer is 10 nm to 150 nm.

10. A manufacture method for a semiconductor light emitting device, said method comprising:

forming a support body by forming a first connection layer above a support substrate;

forming a lamination body above a growth substrate prepared separately from said support substrate, said lamination body being formed by depositing a semiconductor lamination structure including semiconductor active layers, a reflective electrode layer, a diffusion barrier layer having a lamination structure including TaN layers sandwiching at least one refractory metal layer made of one or more refractory metal materials of Ta, Ti, Mo, W and TiW or alloy thereof, and a second connection layer, sequentially in this order;

forming a composite connection layer by coupling said first connection layer of said support body and said second connection layer of said lamination body; and removing said growth substrate, wherein at least one of said first and second connection layers is made of eutectic material, and wherein a thickness of said TaN layer on a side of said composite connection layer is thinner than a thickness of said TaN layer on a side of said reflective electrode layer and thicker than a thickness of said refractory metal layer.

11. The manufacture method for a semiconductor light emitting device according to claim 10, further comprising forming a reflective layer made of dielectric material as a main component, said reflective layer being disposed between said semiconductor lamination structure and said reflective electrode layer and partially covering a surface of said semiconductor lamination structure on a side of said reflective electrode layer.

12. The manufacture method for a semiconductor light emitting device according to claim 11, wherein the thickness of said TaN layer on the side of said reflective electrode layer is thicker than a thickness of said reflective layer.

* * * * *